United States Patent [19]

Beverly, II

[11] Patent Number: 4,922,187
[45] Date of Patent: May 1, 1990

[54] PULSE INITIATOR CIRCUIT

[75] Inventor: William C. Beverly, II, Charlotte, N.C.

[73] Assignee: Appalachian Technologies Corporation, Charlotte, N.C.

[21] Appl. No.: 14,401

[22] Filed: Feb. 13, 1987

[51] Int. Cl.⁵ .................... G01R 21/00; G01R 35/04
[52] U.S. Cl. ...................................... 324/96; 324/74; 324/142; 340/870.02
[58] Field of Search ............... 324/96, 142, 74; 340/870.02, 870.03, 870.29; 250/336.1, 338.1

[56] References Cited

U.S. PATENT DOCUMENTS 4,646,003 2/1987 Phillips et al. ................... 324/74

Primary Examiner—Ernest F. Karlsen
Attorney, Agent, or Firm—James B. Hinson

[57] ABSTRACT

The invention provides an improved pulse initiator circuit for attaching to utility meters to generate a pulse signal having a predetermined relationship to the rate of power usage measured by the utility meter. Electronic circuitry is utilized which automatically compensates for differences in individual utility meters permitting the pulse initiator to be used with any standard utility meter without calibration or adjustemnt. The pulse initiator is attached to the utility meter without breaking the meter seal.

15 Claims, 3 Drawing Sheets

PULSE INITIATOR CIRCUIT

BACKGROUND OF THE INVENTION

1. Field Of The Invention

The invention relates to instruments and more particularly to instruments attachable to conventional watthour meters for generating a pulsed signal having a predetermined relationship to the rate of electrical power usage.

2. Description Of The Prior Art

U.S. Pat. No. 4,063,661 discloses an electric load researchdevice. This patent also describes other prior art devices which require an interconnection between the watthour meter and the external terminal unit and further indicates that these devices are sometimes not adaptable to ringless meter sockets. The instrument which is the subject of this patent requires that the conventional watthour meter be replaced by a modified meter which includes a pulse generator. Additionally, the cabling extends through the meter cover.

U.S. Pat. No. 4,110,814 discloses a watthour meter for use with remote reading devices. The watthour meter enclosure includes an opening therein through which a cable extends for connecting the data sending unit to an external recording instrument.

U.S. Pat. No. 4,491,789 discloses another embodiment of an electrical meter for measuring various parameters related to electric energy consumption. Signals representative of the rate of electrical energy use are coupled as inputs to a time of day multi-function register. The multi-function register communicates by way of light radiation with an external programmer/reader unit.

U.S. Pat. No. 4,298,839 discloses an electrical watthour meter communicating with external devices through an interface using radiated light signals.

U.S. Pat. No. 4,121,147 illustrates an electrical watthour meter for indicating the demand or rate of power usage which is adapted to be mounted between a standard meter socket and a standard meter.

U.S. Pat. No. 3,783,343 further illustrates the art related to watthour meters and discloses apparatus for mounting a watthour meter such that the watthour meter is totally enclosed in a container to protect it from external damage or vandalism.

Electric watthour meters of the variable rate type are further illustrated in U.S. Pat. No. 4,082,999. This invention provides apparatus permitting a standard watthour meter to be controlled such that the rate reduction is automatically calculated by programming the meter.

SUMMARY OF THE INVENTION

As illustrated by the above discussed prior art, research related to the rate at which electric power is used by various customers requires some means be provided for recording electric power usage rate information during selected time intervals. A pulse initiator circuit coupled to a conventional watthour meter and adapted to generate a pulse train having a period determined by the rate of power usage is a convenient means for providing a signal to operate recorders to produce the desired power usage records.

Since such information is not required on a permanent basis, it is highly desirable that research data recording apparatus be designed such that it can be coupled to standard watthour meters without removing the watthour meter from its socket. This is particularly true because, in most jurisdictions, breaking the meter seal requires that the watthour meter be recalibrated.

Removal and recalibration of a watthour meter is both time consuming and expensive without contributing to the basic task of collecting data. Considerable unnecessary lost time and cost could be avoided by utilizing research instrumentation permitting the desired data to be collected without removing the existing watthour meter from its socket. Such instrumentation was not available prior to the invention which is the subject matter of this patent application.

The preferred embodiment of the invention provides a survey instrument which is attachable to existing electric watthour meters without requiring any modification of the existing meters or removal of the meters from the meter socket. More specifically, the instrument is enclosed in a concentric housing which mounts over the existing watthour meter.

The preferred embodiment of the invention includes a pulse initiator circuit, which detects sensor holes in the watthour meter rotor to determine the rate of power usage. A source of radiation is positioned outside of the watthour meter cover and on a first side of the rotor generates a radiated beam which passes through the watthour meter cover and impinges on a first side of the rotor. As the rotor turns, the sensor hole in the rotor passes through the beam to generate a pulsating signal visible on the second side of the rotor with the pulse rate being determined by the rate of rotation of the rotor. The radiation detector, also positioned external to the watthour meter cover, detects this pulsating beam and in response thereto generates a pulse signal whose period has a predetermined relationship to the rate at which the rotor turns.

In the preferred embodiment, the radiation is preferably in the infrared band. Background infrared radiation from other sources such as the sun, makes it desirable to compensate for these background sources.

Separation of radiation from these sources is accomplished by modulating the source of infrared radiation at a predetermined frequency and separating the modulated and unmodulated components of the infrared energy impinging on the detector. Threshold detection techniques are used to eliminate errors due to radiation which may be scattered and impinge on the detector via routes not passing through the sensor hole in the rotor. Other arrangements of signal sources and detectors, with the signal sources and detectors positioned externally with respect to the watthour meter enclosure may be usable, the preferred embodiment described in detail below, being an example of such a pulse initiator circuit.

DETAILED DESCRIPTION

Figure 1:
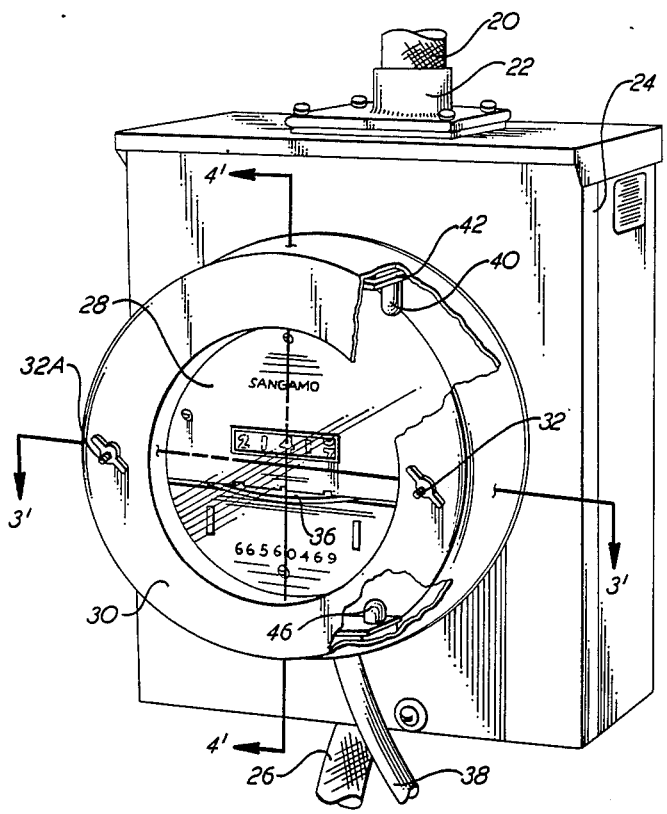
FIG. 1 is a drawing illustrating the major mechanical components of the invention.
Figure 3:
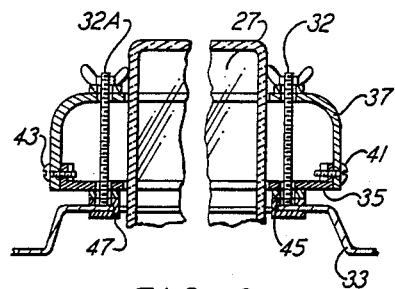
FIG. 3 is a cross-sectional view of the pulse initiator along view line 3'.
Figure 4:
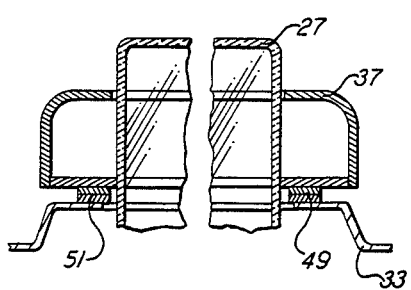
FIG. 4 is a cross-sectional view of the pulse initiator along view line 4'.

FIG. 1 is an isometric view of the preferred embodiment of the invention. As is conventional, an electrical cable 20 is coupled through a standard coupling 22 to a meter socket 24. A second cable 26 provides means for coupling the electrical power to the user. The standard electric meter 28 is plugged into the meter socket 24 in a conventional manner.

The pulse initiator device 30 comprising the preferred embodiment of the invention is circular in shape and slides over the watthour meter 28. Securing means comprising two bolts 32 and 32A are attached to the meter socket cover 27 and extend through the housing of the pulse initiator 30. A pulsed electrical signal indicative of the rate of rotation of the rotor 36 of the watthour meter 28 is coupled to an external instrument (not illustrated) such as a recorder by a conventional cable 38.

The electronic components of the pulse initiator 30 are enclosed in a circular housing which includes circular base member 35 and cover 37. The cover 37 has a side portion attached to the base member 35 and is substantially perpendicular thereto. The cover 37 also includes an inwardly extending lip terminating in a circular opening through which the cover 27 of the watthour meter 28 extends. Conventional wing nuts in conjunction with bolts 32 and 32A secure the pulse initiator 30 in a fixed position with respect to the meter socket cover 33.

Suitable means for attaching the base 35 to the cover 37 is required. In the preferred embodiment, the base member 35 includes four equally spaced upward extending ears permitting the base 35 to be attached to the cover 37 using bolts as typically illustrated at reference numerals 41 and 43. Spacers 45, 47, 49 and 51 are evenly spaced and hold the pulse initiator 30 in a fixed portion with respect to the wattmeter socket cover 33 as the wing nuts are tightened on bolts 32 and 32A. Spacers 45 and 47 also include clip portions extending over the inner perimeter of the meter socket cover 33. Two threaded holes in spacers 45 and 47 provide support for bolts 32 and 32A.

Figure 2:
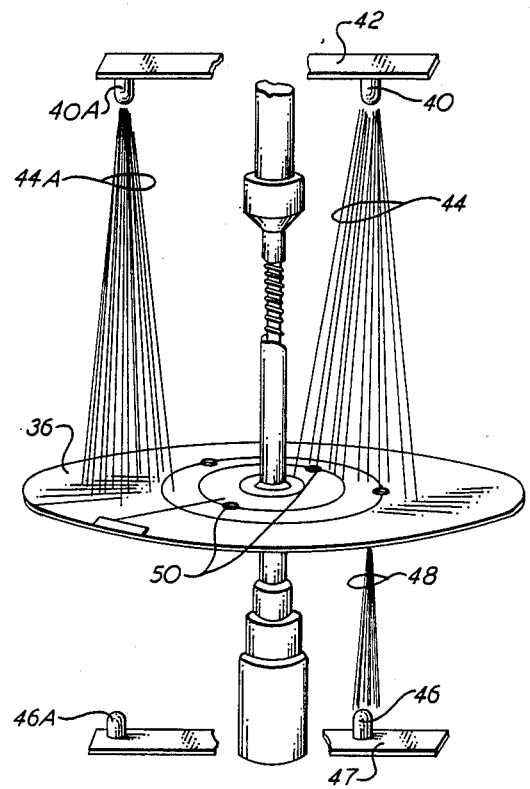
FIG. 2 is a drawing illustrating the rotor of a watthour meter and its position with respect to the radiation source and the radiation detector.

The pulse initiator 30 includes a radiation source 40 and a radiation detector 46 which are respectively mounted on circuit boards 42 and 46. The radiation source 40 and the radiation detector 46 may be mounted on either side of the axis of rotation of the rotor 36. The alternate locations for the radiation source and the radiation detector are illustrated at reference numbers 40A and 46A (FIG. 2). The circuit boards 42 and 47 are adapted to be attached to the inner surface of the cover 37 of the pulse initiator 30 and may be held in a fixed relationship with respect to the cover 37 of the pulse initiator using any convenient means.

When so positioned, the radiation source 40 generates a beam of radiation 44 (FIG. 2) which impinges on the first or upper side of the rotor 36. The radiation detector 46 is positioned with respect to the radiation source 40 such that rotor 36 is positioned therebetween. As the rotor 36 rotates, sensor holes in the rotor 36 (typically illustrated at reference No. 50) cooperate with the beam 44 to produce a pulsating beam 48. The detector 46 detects the pulsating beam 48.

Alternatively, the radiation source and the detector may be positioned on the opposite side of the rotor shaft, as illustrated at reference nos. 40A and 46A. Any convenient means for mounting the circuit boards 42 and 47 in desired relationship to each other and to the rotor 36 is usable. Also, it should be noted that the critical function performed by this arrangement is the production and sensing of the pulsating (modulated) beams 48 and 48A. Other arrangements of signal sources and detectors may be capable of performing this function. The radiation source and radiation detector pairs, illustrated in FIG. 2 can be spaced at different distances from the axis of rotation of the rotor 36. Such an arrangement can be advantageous because all watthour meters do not have the sensing holes 50 at the same distance from the axis of the rotor.

All watthour meters have sensor holes in the rotor, however the spacing of the hole from the axis of the rotor depends on the manufacturer. Multiple sensor/detector pairs spaced different distances from the axis of rotation are necessary if the pulse initiator is to be universal.

Figure 5:
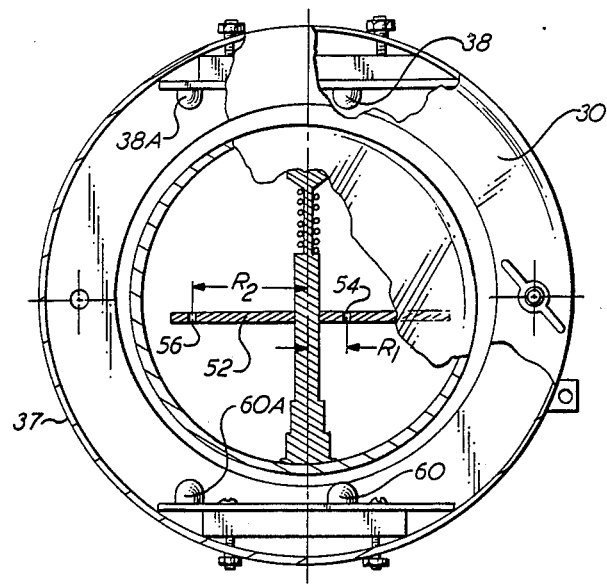
FIG. 5 is a cross-sectional view illustrating the placement of multiple radiation sources and multiple detectors with respect to the meter rotor.

FIG. 5 is a cross-sectional view of the pulse initiator apparatus 30 and a modified rotor 52. This embodiment of the invention includes two typical sensor hole spacings and two source/detector pairs. The rotor 52 is illustrated as having first and second sensor holes 54 and 56 therein positioned at first and second radiuses R1 and R2 from the axis of rotation of the rotor 52. In the illustrated embodiment, source/detector pair 38 and 60 is positioned to operate with sensor hole 54 spaced at radius R1. Similarly, source/detector pair 38A and 60A is positioned to operate with sensor hole 56 positioned at radius R2. Inclusion of a source/detector pair corresponding to the sensor hole radius used by all of the major watthour meter manufacturers results in the pulse initiator being essentially universal, because all watthour meters are designed to mate with a standard meter socket. Unused source/detector pairs have little effect except for a slight increase in the scattered radiation. Pulse initiator circuits using four source/detector pairs have been tested. Additional source/detector pairs may be usable.

The arrangement in which source/detector pairs are positioned on opposed sides of the rotor axis is advantageous in that it reduces interference between source/detector pairs due to scattered radiation. Other techniques for reducing interference, such as covering unused sources may be used with some loss of convenience.

Figure 6:
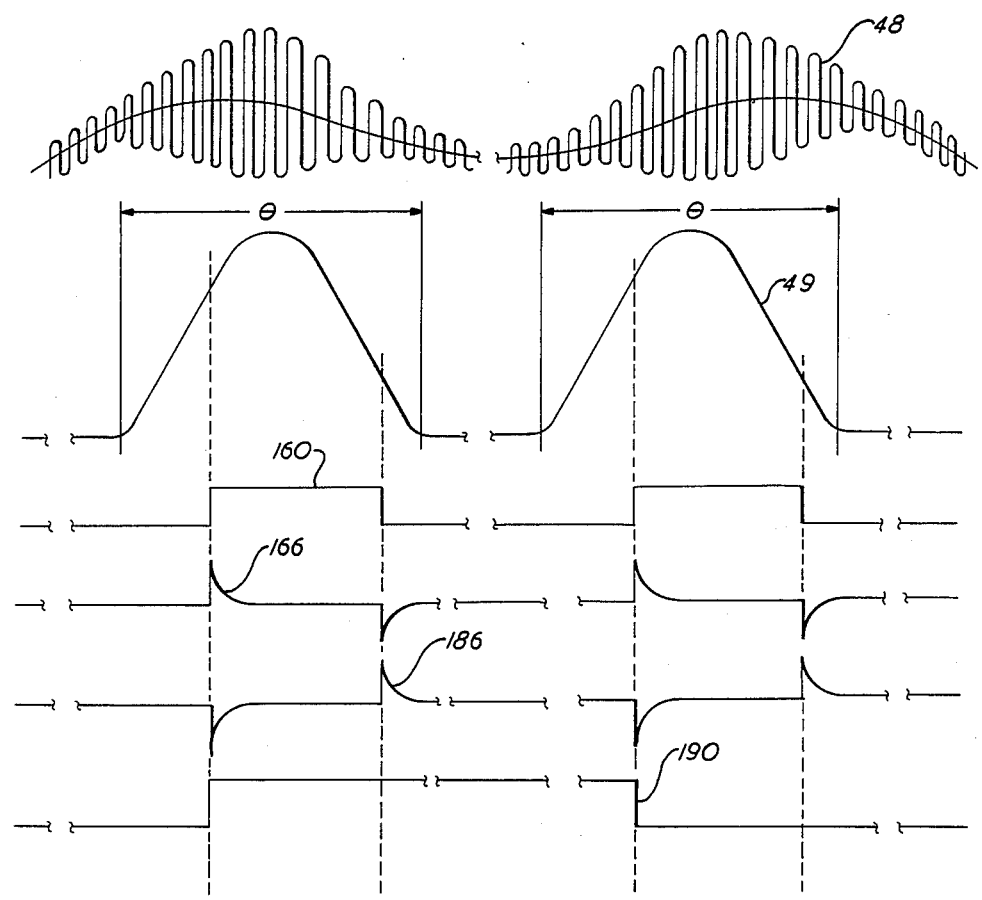
FIG. 6 is a waveform diagram illustrating operation of the electronic portions of the invention.

FIG. 6 is a waveform diagram illustrating the operation of the electronic circuits illustrated in FIG. 5. The function of the electronic circuitry is to provide power to operate the radiation sources and to detect the modulated infrared beams. The operation of this circuit will be described with respect to a single radiation source 40 and a single detector 46. However, it will be appreciated that additional detectors can be connected in parallel, as previously illustrated. Source/detector pairs not aligned with a sensor hole in the rotor are essentially inactive. Unused sources and detectors contribute to the background radiation signals which are removed by the electronic circuitry which automatically adjusts the for background radiation and for changes in the background radiation.

Figure 7:
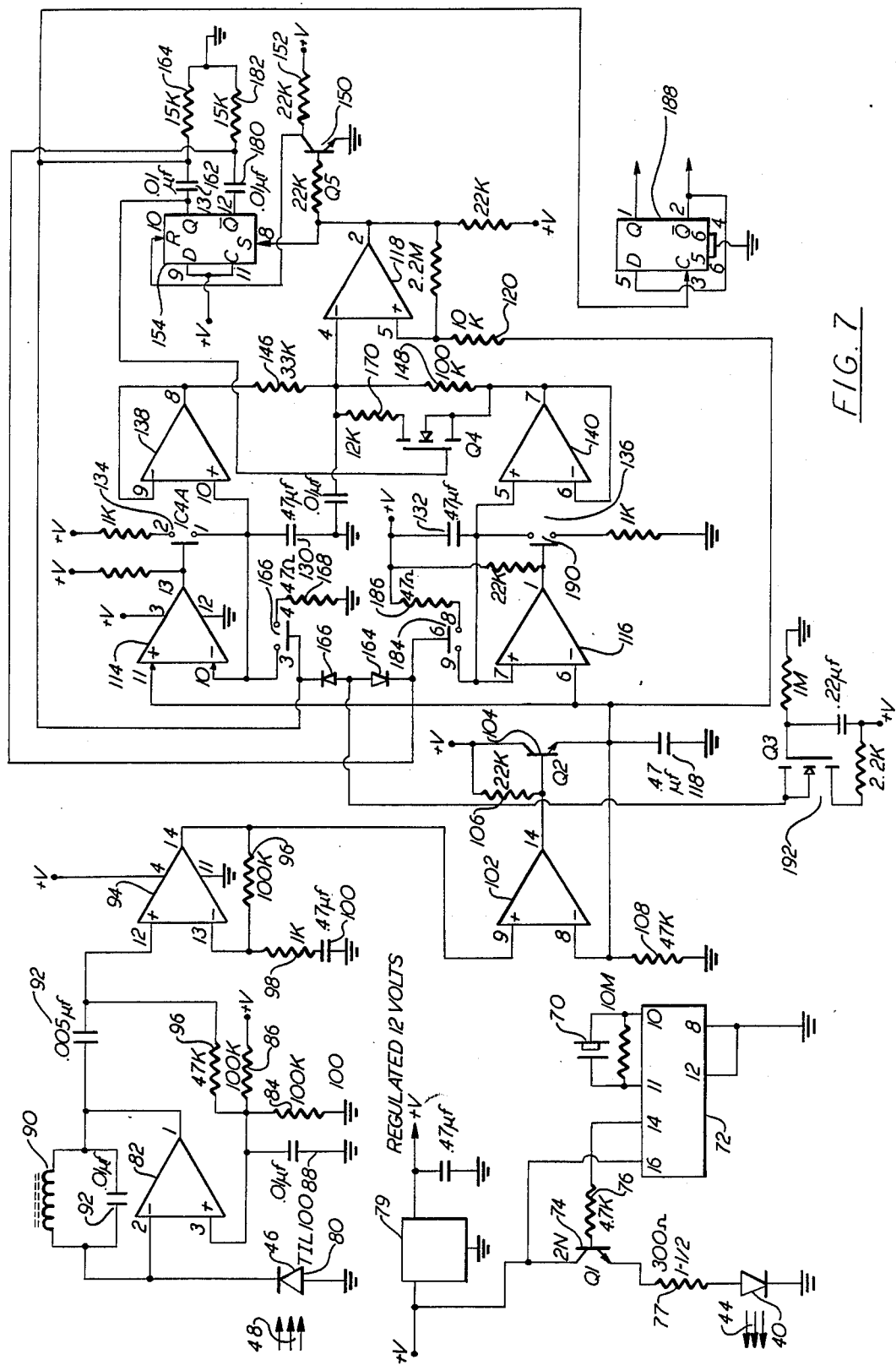
FIG. 7 is a schematic diagram of the circuit used in the invention.

As previously discussed, the radiation source, infrared emitting diode 40, is driven by a suitable current source to produce a beam of infrared beam radiation 44 which is modulated (preferably amplitude modulated) at a predetermined rate to facilitate automatic compensation for background and unintentionally scattered radiation. Referring to FIG. 7, suitable modulation is accomplished by using an oscillator to produce a signal whose frequency is determined by a crystal 70. In the preferred embodiment the oscillator operates at a frequency of 3.58 megahertz. This frequency is preferred because it permits standard widely used crystals and oscillator components to be used.

The active portion of the oscillator is provided by a commercially available integrated circuit 72 which also includes counters which count the 3.58 megahertz oscillator signal down to produce a 13.982 kilohertz modulation signal. This circuit and frequencies were selected to permit use of commercially available circuits. Other frequencies and circuit arrangements are usable.

Typically the modulation signal produced by integrated circuits does not have sufficient current capacity to drive the radiation source 40. Additional current capacity is provided by an amplifier consisting of a conventional transistor 74, base resistor 76 and an emitter resistor 77. The output signal of the oscillator is coupled to the base of transistor 74 through a base resistor 76. A positive bias voltage is applied to the collector of the transistor 74 from a DC power source. The remainder of the circuitry is designed to operate from a regulated 12 volt DC source which is provided by a conventional regulator 79.

Infrared light emitting diode 40 is driven from the emitter of the transistor 74 through a series coupled resistor 77. As a result a current which is modulated 13.982 kilohertz flows through the infrared light emitting diode 40 to produced an amplitude modulated beam 44. The modulated beam 44 impinges on the rotor 36, as illustrated in FIG. 2, and is further modulated by the rotor 36, as it rotates. The infrared radiation detection diode 46 is positioned such that the modulated infrared beam 48 impinges thereon. In response to the pulse modulated beam 48, the infrared diode detector 46 produces a signal proportional to the instantaneous intensity of the radiation impinging thereon.

Those skilled in the art will appreciate that the composite output signal 47 of the infrared diode detector 46 will include components corresponding to the intentional modulation components of beam 48, components due to scattered radiation and components due to background radiation. This composite output signal 47 of the diode is detector 46 is coupled to the inverting input of an amplifier 82. A bias signal is provided to the second input of the amplifier 82 by a resistor divider network consisting of two resistors 84 and 86 and filter capacitor 88. A feedback circuit tuned to 13.982 khertz limits the bandwidth of the amplifier to remove signal components due to background radiation because most background radiation signals have a much lower frequency. Background radiation is functionally represented by the varying baseline 51 of the output signal of the diode detector 46. Modulation of the beam 44 by the 13.982 Khertz modulation signal and by the roter produces the high frequency amplitude modulated components of the composite output signal 47.

More specifically, the output signal 47 of the infrared detector diode 46 is coupled to the inverting input of an amplifier 82. A parallel tuned feedback circuit consisting of an inductor 90 and a capacitor 92 provides feedback from the output terminal of the amplifier 82 to its inverting input. This parallel tuned circuit in conjunction with amplifier 82 comprises an amplifier circuit having a bandwidth determined by the parallel tuned circuit. This circuit is tuned to 13.982 kilohertz, thus eliminating signals not within the bandwidth of the amplifier circuit.

Signals outside the bandwidth of the amplifier circuit are typically due to sunlight and artificial light sources such as automobile headlights. Unintentionally scattered radiation from the radiation source 40 may be within the bandwidth of the amplifier circuit. However, these modulation components are compensated for using threshold detection.

The capacitor 92 couples the output signal of the amplifier circuit to the non-inverting input of a second amplifier 94. Bias to the non-inverting input of the second amplifier 94 is provided by a resistor 96 coupled between the non-inverting input of amplifier 94 and the junction of resistors 84 and 86.

A network consisting of two series coupled resistors 96, 98 and capacitor 100 forms a feedback network around the second amplifier 94 to stabilize its AC gain and to adjust the DC operating point of the output of this amplifier to about six volts. In this configuration, amplifier 94 provides additional amplification of the 13.982 kilohertz component of the output signal 47 of diode detector 46.

The output signal of the second amplifier 94 is coupled to the non-inverting input of a third amplifier 102. A transistor 104 has its base coupled to the output of the third amplifier 102 and to the positive voltage source through a 22 K resistor 106. The emitter terminal of the transistor 104 is directly coupled to the inverting input of amplifier 102, which is in turn coupled to the ground terminal of the circuit by a 47 K resistor 108. In the absence of an infrared input signal, this arrangement biases the output of amplifier 102 to about six volts DC and charges capacitor 118 through transistor 104 to approximately six volts.

During the transitions of the output signal of amplifier 102 above the voltage stored in capacitor 118, the base to emitter junction of transistor 104 is forward biased to further charge capacitor 118. Transitions of the output signal of the third amplifier 102 below the voltage stored in capacitor 118 reverse biases the base to emitter junction of transistor 104 causing this transistor to become non-conducting, resulting in capacitor 118 discharging through resistor 108. Thus, the combination of the third amplifier 102 and the transistor 104 along with the various other circuit elements associated therewith comprises a precision rectifier producing a positive voltage at the emitter of transistor 104 which substantially follows the envelope of the output signal of the second amplifier 94. This signal is illustrated at reference No. 49, FIG. 6.

The low points or the valleys of the output signal 49 of the precision rectifier are primiarly determined by the scattered radiation from the infrared source 40. Similarly, the peak value of this signal is determined by the maximum intensity of the infrared beam 48. High and low reference signals corresponding to these values are used to compensate for scattered radiation, as subsequently described.

The positive variable amplitude DC voltage appearing at the emitter of transistor 104 is also coupled to the non-inverting input of an amplifier 114, the inverting input of amplifier 116 and to one terminal of a resistor 120. Amplifier 114 amplifies the DC output voltage of transistor 104 and charges a capacitor 130 to its peak through an analog switch 134. Similarly amplifier 116 charges a second capacitor 132 to a voltage representing the lower limit or valley of the output voltage of transistor 104 through analog switch 190. The voltages stored by capacitors 130 and 132 are respectively amplified by unity gain amplifiers 138 and 140 to produce a high and a low reference voltage, described above. These reference voltages are combined in a resistor network consisting of two resistors to alternately produce, depending on the state of flip-flop 154, high and low threshold voltages at the inverting terminal of amplifier 118 to automatically compensate for scattered radiation and changes in the peak value of the modulated beam 48.

The threshold state is determined by the state of flip-flop 154. Specifically, the high and the low threshold states respectively correspond to the high and low states of the output signal at the "Q" output terminal of this flip-flop. As the input voltage coupled to the non-inverting input of comparitor 118 exceeds the high threshold voltage, the output of comparitor 118 goes positive. Positive feedback is provided by resistors 151 and 153 to stabilize the amplifier 118 to prevent noise from changing the state of its output signal. This positive voltage is coupled through a resistor 149 to the input of a transistor 150 causing this transistor to turn on. As the transistor 150 turns on, the voltage at its collector goes to ground. The set and reset terminals of flip-flop 154 are respectively coupled to the output of the comparitor 118 and to the collector of transistor 150. This causes the Q output of flip-flop 154 to be set to its positive value as illustrated at reference numeral 160, FIG. 6. As is the case with all flip-flop circuits, the second output is the inversion of the signal 160. This signal is not illustrated in FIG. 6.

As the voltage at the Q output terminal of flip-flop 154 changes a pulsed signal 166 is generated by a differentiator circuit consisting of a capacitor 162 and resistor 164. The positive pulses of this signal turn on an analog switch 166 to discharge capacitor 130 through a 47-ohm resistor 168. After this signal returns to zero the analog switch 166 turns off and capacitor 130 is charged through analog switch 134 to the peak value of signal 9. This peak voltage is maintained for a long period of time because the discharge paths are the input impedances of amplifier circuits 114 and 138 along with the leakage of a capacitor 130.

Additionally, the level of the Q output of flip-flop 154 turns on analog switch 168 to couple a 12-K resistor 170 in parallel with the 100-K resistor 148. This changes the ratio of the divider network and reduces the threshold voltage to its low value of approximately ⅓ of the difference between the high and low values of signal 49 as compared to its value of about ⅔ this difference when the analog switch 168 is turned off.

As the rotor 36 rotates, the infrared beam transmitted through the sensor holes in the rotor declines until it reaches a value corresponding to the low threshold voltage coupled to inverting input of the caparator 118. As the voltage coupled to the non-inverting terminal of comparitor 118 falls below this value, the output voltage of the comparitor 118 switches to zero causing the transitor 150 to turn off changing the state of flip-flop 154. A second capacitor 180 and a resistor 182 are series coupled between the second output terminal of flip-flop 154 and ground. This forms a second differentiator circuit to produce a second pulsed signal 186. The positive pulses of this signal turn on analog switch 184 to charge a capacitor 132 to the positive supply voltage through a 47-ohm resistor 186. When this signal declines to near zero, analog switch 184 is turned off charging capacitor 132 to the minimum value of signal 49 through an analog switch 190. This sets the minimum threshold to a value corresponding to the valley of signal 49.

Typically, the meter rotor 36 will include at least two sensor holes spaced 180° apart as illustrated at reference numeral 50 in FIG. 2. This being the case, the flip-flop 154 will change state at a rate equal to four times the rotational speed of the rotor 36. The output signal of the first differentiator consisting of capacitor 162 and resistor 164 is coupled to the clock input of a flip-flop 188 to produce a signal 190 which has a repetition rate proportional to the rational speed of the meter rotor.

As described above, flip-flop 154 is triggered at first and second points respectively corresponding to a point in time when the output signal of the precision rectifier has a value which exceeds the high threshold, which is two-thirds of the difference between the two references and when this signal diminishes below the low threshold, which is one-third of this difference.

At the beginning of operation, that is when the power is turned on, a reset circuit consisting of switch 192 and diodes 164 and 166 produce a positive going pulse which turns on analog switches 166 and 184 to discharge capacitors 130 and 132. Additionally, the state of flip-flops 154 and 188 may be indeterminate at the beginning of operation. This could result in an extra pulse being generated or deleted for the first rotation of the rotor. This is normally of no concern in that this kind of inaccuracy is not detrimental when the pulse initiator is used as a survey instrument. Should this be of concern, suitable means could be included to assure that the flip-flops always come up in a known state and that the reference voltage coupled to the inverting input of comparitor 118 is a reasonable value.

The above described invention can be constructed utilizing well known components and techniques. Thus, no detailed part numbers are included. Additionally, the basic process for detecting the rotation of the meter described above can be implemented using digital techniques. Other modifications of the invention are also possible.

It will also be appreciated by those skilled in the art that the maximum and minimum levels of modulated beam will be somewhat dependent on the installation, however, these changes are automatically compensated for as described above. Additionally, the basic process for detecting the rotation of the meter described above can be implemented using digital techniques. Other modifications of the invention are also possible.

I claim:

1. An instrument attachable to an electric utility meter for generating a pulsed signal having a predetermined relationship to parameters measured by said utility meter, comprising in combination:
   a. a signal source for providing a signal modulated in accordance with a first function;
   b. a signal detector responsive to said modulated signal;
   c. enclosure means having an interior and including first and second spaced apart end portions, an edge portion extending between the outer periphery of said first and second end portions, each of said end portions also including an opening therein;
   d. means for mating said enclosure with said utility meter such that the rotor of said utility meter is positioned at a predetermined location with respect to the interior of said enclosure;

e. means for supporting said signal source at a predetermined location outside the cover of said utility meter and within the interior of said enclosure such that said utility meter interacts with said modulated signal to further modulate said modulated signal in accordance with a function having a predetermined relationship to the parameters measured by said electric utility meter; and f. means for supporting said sensor at a predetermined location outside the cover of said utility meter and within the interior of said enclosure such that said modulated signal interacts therewith to produce said pulsed signal having a predetermined relationship to the parameters measured by said utility meter.

2. An instrument in accordance with claim 1, wherein said electric utility meter is a watthour meter and wherein said signal source comprises an infrared source supported by a structure which is attachable to said watthour meter without removing said watthour meter from its socket.

3. An instrument in according with claim 2 wherein said signal detector is also supported by said structure such that when said structure is attached to said watthour meter said signal source and said signal detector are selectively positioned with respect to the rotor of said watthour meters.

4. An instrument in accordance with claim 3 wherein said instrument includes electronic circuitry for automatically compensating for background signals within the range of said sensor.

5. An instrument in accordance with claim 4 wherein said instrument includes electronic circuitry for automatically compensating for scatter signals originating with said signal source.

6. An instrument in accordance with claim 5 wherein said electronic circuitry automatically compensates for background signals by limiting the bandwidth of said electronic circuits to reject said background signals.

7. An instrument in accordance with claim 6 wherein said electronic circuitry includes means for modulating said signal source at a predetermined rate.

8. An instrument in accordance with claim 7 wherein said signal source is amplitude modulated.

9. An instrument in accordance with claim 8 wherein said electronic circuitry utilizes threshold techniques to compensate for said scattered signals.

10. An instrument in accordance with claim 8 further including means or demodulating said amplitude modulated signal to generate first and second reference signals to which said demodulated signal is compared to generate said pulsed output signal.

11. An instrument for sensing the motion of a device which is positioned within a cover which is transparent to a signal of a predetermined type, comprising in combination:

a. means for generating a signal modulated by a first source positioned outside said transparent cover;

b. signal detector means responsive to said modulated signal positioned outside said transparent cover;

c. means for supporting said signal source such that said modulated signal interacts with said device to produce a signal modulated by said first source and by the motion of said device;

d. means for supporting said detector such that said modulated signal is further modulated by the motion of said device and interacts with said second to produce a signal having a predetermine relationship to the motion of said device; and e. means for automatically adjusting said signal detector means to compensate for ambient signals originating by sources other than said means for generating a modulated signal.

12. An instrument, attachable to an electric utility meter for generating a pulsed signal having a predetermined relationship to parameters measured by said utility meter, comprising in combination:

a. a signal source for producing a signal, modulated by a first source positioned outside the cover of said electric utility meter;

b. a detector means positioned outside said cover of said utility meter; and c. fixed means for supporting said signal source and said detector means in a position such that said utility meter interacts with said modulated signal to produce at the output of said detector a pulsed signal having a predetermined relationship to the parameters measured by said electric utility meter.

13. An instrument in accordance with claim 12, wherein said electric utility meter is a watthour meter and wherein said signal source is supported by a structure which is attachable to and concentric with said watthour meter without removing said watthour meter from its socket.

14. An instrument in accordance with claim 13 wherein said signal detector is also supported by said structure such that when said structure is attached to said watthour meter said signal source and said signal detector are selectively and accurately positioned with respect to the rotor of said watthour meter, without the necessity for manual, mechanical position adjustments.

15. An instrument in accordance with claim 14 wherein a multitude of said signal sources and said signal detectors provide compatibility with more than one manufacturer's watthour meter.

* * * * *